United States Patent [19]
Suzuki et al.

[11] Patent Number: 5,412,214
[45] Date of Patent: May 2, 1995

[54] PROJECTION EXPOSURE METHOD AND APPARATUS WITH FOCUS DETECTION

[75] Inventors: Hiroyuki Suzuki; Osamu Furukawa, both of Tokyo, Japan

[73] Assignee: Nikon Corporation, Tokyo, Japan

[21] Appl. No.: 86,984

[22] Filed: Jul. 7, 1993

[30] Foreign Application Priority Data

Jul. 9, 1992 [JP] Japan ................. 4-182051

[51] Int. Cl.⁶ ............................................ G01N 21/86
[52] U.S. Cl. .................... 250/548; 250/201.4
[58] Field of Search .......................... 250/201.4, 548; 356/400, 401; 358/412, 448, 486

[56] References Cited

U.S. PATENT DOCUMENTS

| | | | |
|---|---|---|---|
| 4,558,949 | 12/1985 | Uehara et al. | 356/152 |
| 5,050,111 | 9/1991 | Ayata et al. | 356/400 |
| 5,151,750 | 9/1992 | Magome et al. | 356/401 |
| 5,243,195 | 9/1973 | Nishi | 250/548 |

*Primary Examiner*—David C. Nelms
*Attorney, Agent, or Firm*—Shapiro & Shapiro

[57] ABSTRACT

A projection exposure method and apparatus are disclosed, which can perform a focusing operation with respect to a partly omitted shot exposed at a peripheral portion of a photosensitive substrate such as a wafer. In the projection exposure method and apparatus, when a prohibition band having a predetermined width is set from the edge of the substrate, and exposure is to be performed with respect to a shot area having a portion located only within the prohibition band and the remaining portion located outside the edge of the substrate, a focus detection point is shifted to the boundary line of the prohibition band on the substrate, and a focusing operation is performed. Thereafter, the focus detection point is moved to an original target shot exposure position to perform exposure.

5 Claims, 10 Drawing Sheets

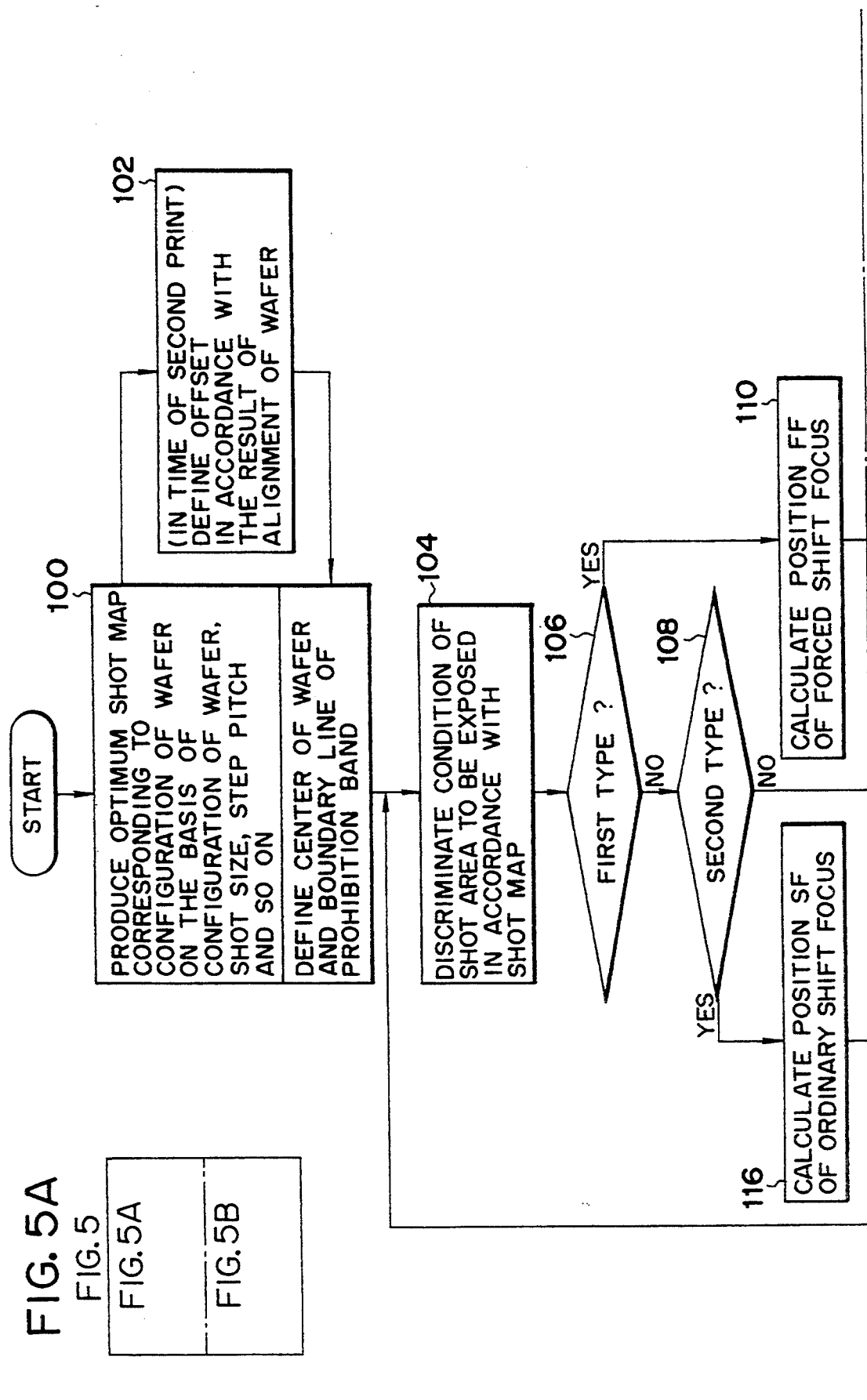

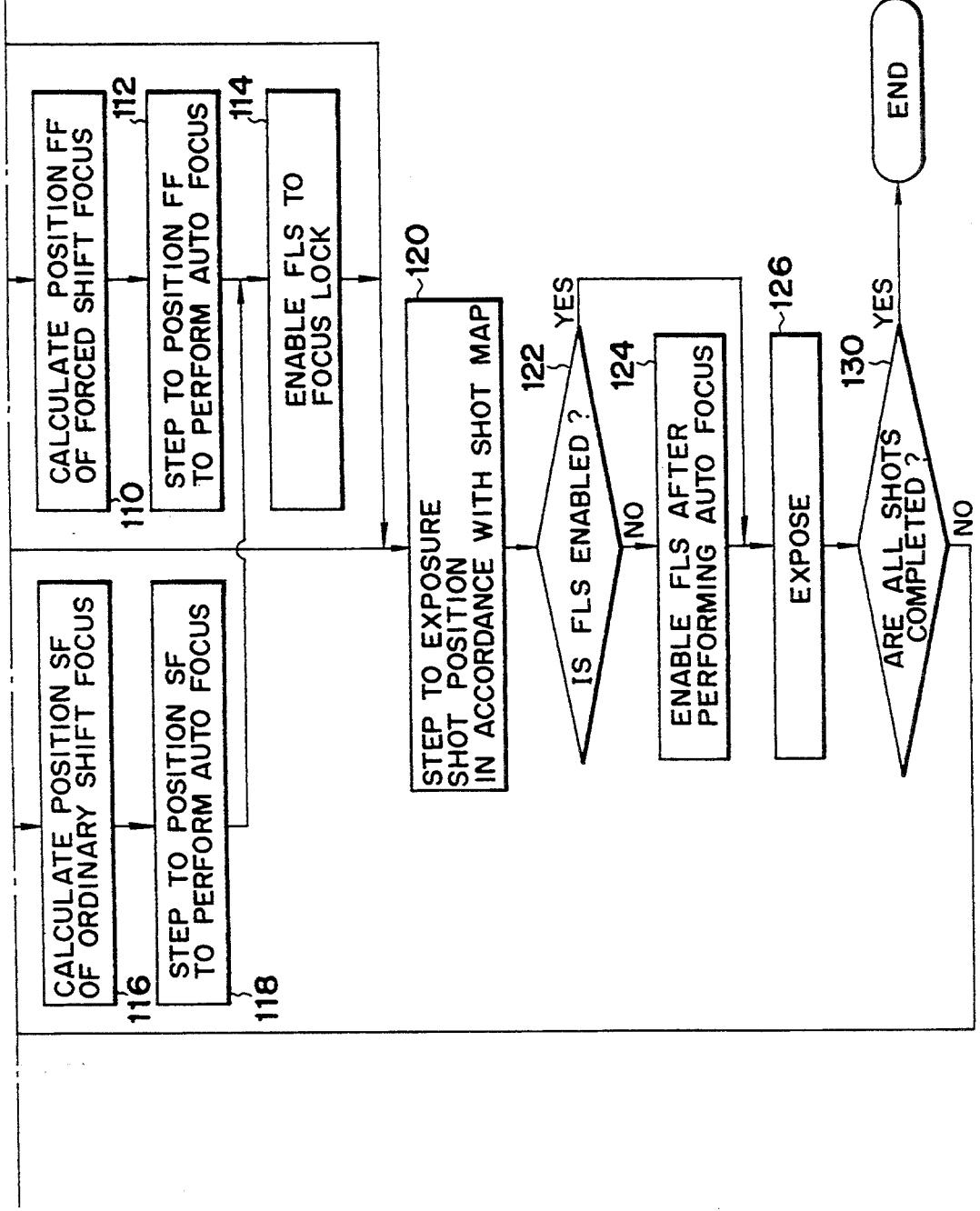

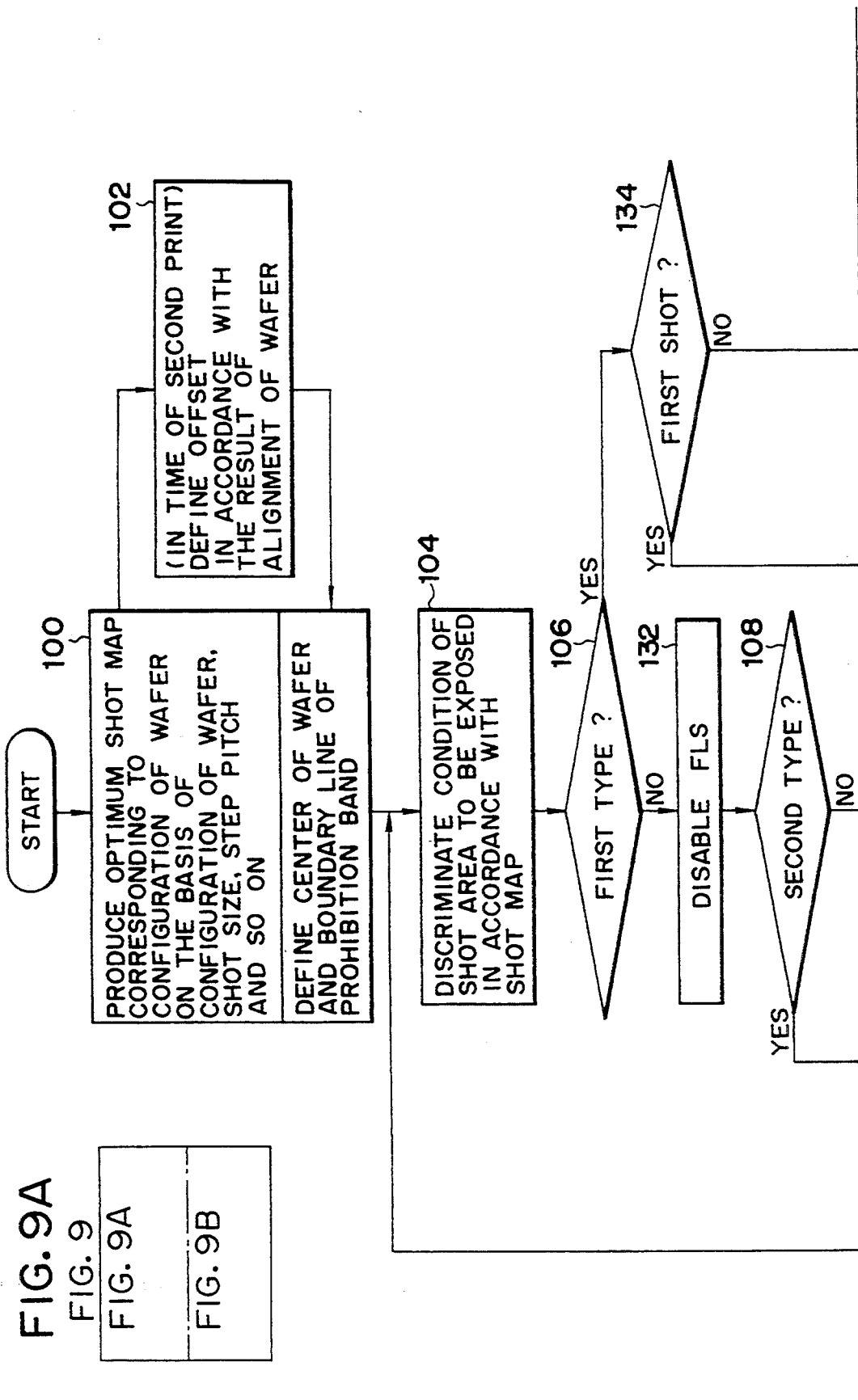

PROJECTION EXPOSURE METHOD AND APPARATUS WITH FOCUS DETECTION

BACKGROUND OF THE INVENTION

1. Field of the Invention

The present invention relates to a projection exposure apparatus designed to move a photosensitive substrate by a step-and-repeat scheme when a pattern of a mask (reticle) is exposed onto the photosensitive substrate through a projection optical system and, more particularly, to an apparatus designed to optimize a focusing operation with respect to a shot area, on a photosensitive substrate, which is to be exposed.

2. Related Background Art

In a projection optical apparatus of a step-and-repeat scheme (stepper), a wafer mounted on a two-dimensional moving stage is stepped in the X or Y direction by a predetermined pitch, and a projection image of a pattern on a reticle is exposed. This operation is repeatedly performed. In this case, the wafer is finely moved in a projection optical axis direction by a Z stage on the moving stage to match the wafer surface with the optimum image plane of a projection optical system for each shot area (onto which a pattern projection image of the reticle is to be transferred), on the wafer, which is to be exposed, i.e., to perform a focusing operation. As disclosed in, e.g., U.S. Pat. No. 4,558,949, an oblique incident type focus detection system for obliquely projecting an imaging beam (non-exposure wavelength) onto the upper surface of a wafer and photoelectrically detecting reflected light is used as a focus sensor for a focusing operation. An imaging beam from this focus detection system forms a spot image or a slit image on a portion of the upper surface of a wafer normally located in substantially the center of the projection field of the projection optical system. Therefore, the positional shift amount, i.e., the focus shift amount, of the wafer surface in the optical axis direction is measured, on the basis of the photoelectrically detected signal, by referring to a position at which reflected light photoelectrically detected when the wafer surface is matched with the optimum image plane of the projection optical system is received. The position of the Z stage in the optical axis direction is servo-controlled to nullify the detected focus shift amount, thereby completing an auto focus operation.

In a stepper, such an auto focus operation is normally performed every time exposure is performed with respect to a shot on a wafer. That is, immediately after the moving stage is stepped to match the central point of one shot area with the central point of a projection image of a reticle pattern (substantially the center of the projection field), auto focus is executed by the focus detection system, and exposure is started when the Z stage comes to rest. Such a sequence is employed by the stepper.

In a stepper designed to expose a wafer, a reticle pattern to be projected generally has a rectangular shape. In contrast to this, a wafer is circular. For this reason, if shot areas are arrayed in the X and Y directions in the form of a matrix, part of a shot area near the circular peripheral portion of the wafer is omitted. The manner of omission varies depending on the arrangement of shot areas on a wafer. For this reason, after stepping is performed with respect to a shot area located in a wafer peripheral portion, the detection point (a spot image or a slit image formed by projection of oblique incident light) of the focus detection system may be located outside the wafer while the shot area is positioned in the center of the projection field.

In this case, since a focusing operation with respect to such a shot area cannot be quickly performed, exposure is performed without performing a focusing operation, or is performed while the detection point is fixed to a focus position (the position of the Z stage) in an immediately preceding shot area where a focusing operation has been properly performed. Even if, therefore, a shot area has a multi-chip structure and includes chips which can be acquired as valid chips, exposure is performed with respect to such chips without properly performing a focusing operation. This conflicts with the demand that chips including ones in a peripheral portion of a wafer should be efficiently acquired.

SUMMARY OF THE INVENTION

It is an object of the present invention to provide a projection exposure apparatus incorporating a focusing system capable of executing an efficient focusing operation with respect to shot areas located in a peripheral portion of a photosensitive substrate to save chips located in the peripheral portion as many as possible (to perform exposure upon performing a proper focusing operation).

An apparatus according to the present invention comprises specific shot discriminating means (step 104) for, when a portion extending from an outer peripheral end (WE) of the photosensitive substrate (wafer W) to have a substantially predetermined width is set as a prohibition band, discriminating, on the basis of design arrangement information (shot map data reflecting a result of wafer global alignment in a second print operation) of the plurality of shot areas ($SA_1$, $SA_2$, ...) with respect to a configuration of the photosensitive substrate, that a shot area entirely located outside a boundary line (LL) of the prohibition band is of a first type, and that a shot area ($SA_2$, $SA_3$), of shot areas located within the projection field (PLF) in an exposure operation, which is partly located inside the boundary line (LL) of the prohibition band while the detection point (slit image SB) of the focus detection system (light-emitting element AFP, light-receiving element AFR, control system AFU) is located outside the boundary line (LL) is of a second type, first shift control means (steps 106, 110, 112) for, when a focusing operation is to be performed with respect to a shot area ($SA_1$) of the first type in an exposure operation, temporarily shifting the moving stage (21) such that a point ($P_{ff}$) at which a straight line ($K_2$) passing a specific point ($SC_1$) in the shot area and a central point ($CC_w$) of the photosensitive substrate crosses the boundary line (LL) is matched with a focus detection point (slit image SB), and second shift control means (steps 108, 116, 118) for, when a focusing operation is to be performed with respect to a shot area ($SA_2$) of the second type in an exposure operation, temporarily shifting the moving stage (21) such that a point ($P_{sf}$) located on a straight line ($K_2$) passing a point ($SC_2$), in the shot area ($SA_2$), located closest to a center ($CC_w$) of the photosensitive substrate and the central point ($CC_w$) of the photosensitive substrate and located within the shot area ($SA_2$) inside the boundary line (LL) is matched with the focus detection point (slit image SB).

According to the arrangement of the present invention, even if focus detection cannot be performed or cannot be stably performed (e.g., focus detection can be performed with respect to only one point in a multipoint AF system) with respect to a partly omitted shot located in a peripheral portion of a photosensitive substrate in a step-and-repeat exposure operation, a proper focusing operation can be performed with respect to chip areas saved in the partly omitted shot. In addition, with respect to a shot area (first type) having a portion located in only a prohibition band but having no part located inside an effective focus allowable range, since the possibility that a chip area to be saved is partly omitted is high, the moving distance of the stage is set to be minimized to realize a shift focus operation while suppressing a reduction in throughput.

BRIEF DESCRIPTION OF THE DRAWINGS

FIG. 9 is comprised of FIGS. 9A and 9B showing a flow chart for explaining a sequence in the third embodiment.

DETAILED DESCRIPTION OF THE PREFERRED EMBODIMENTS

Figure 1:
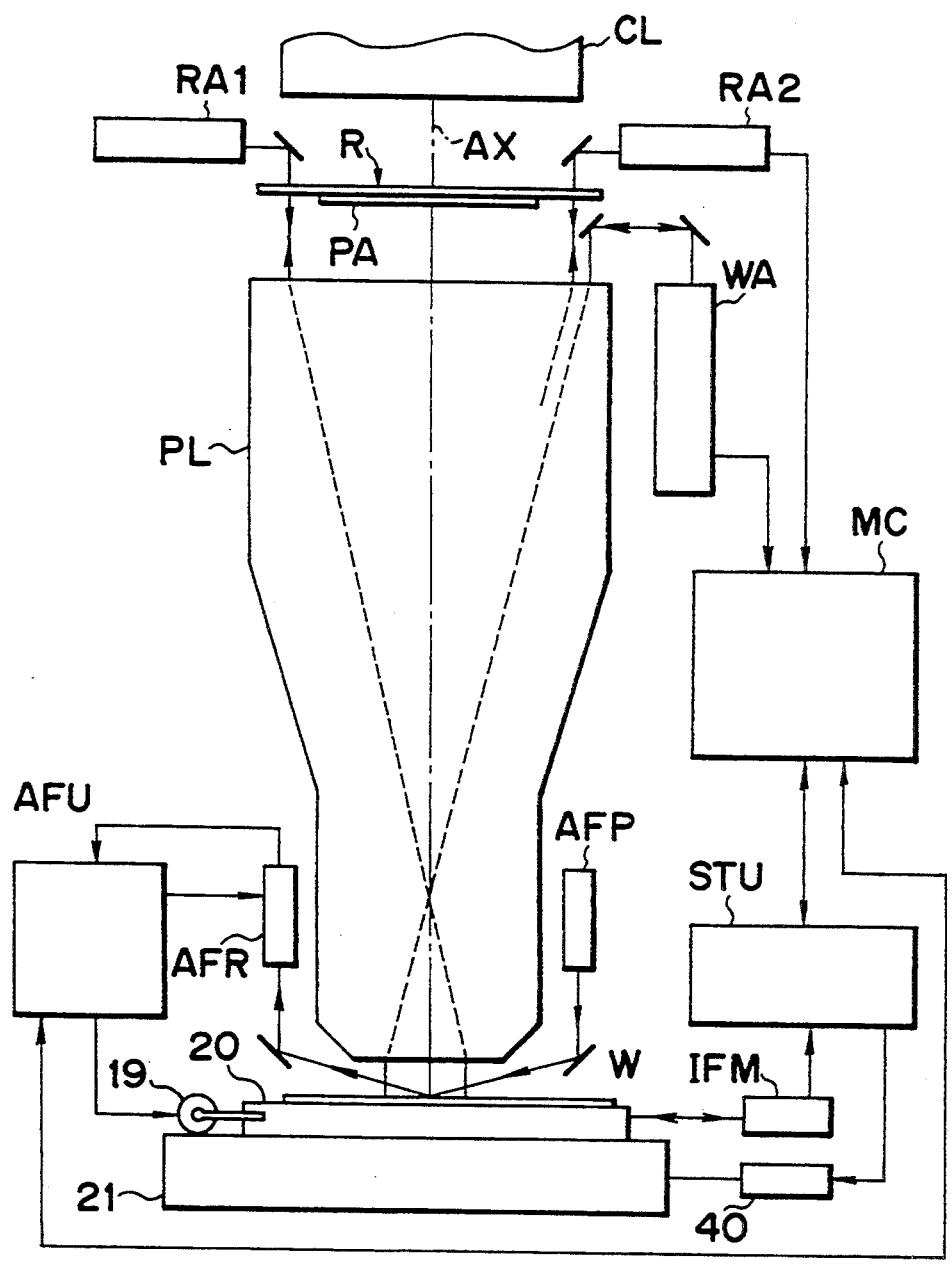
FIG. 1 is a view showing the arrangement of a projection exposure apparatus to which the present invention is applied.

FIG. 1 shows the overall arrangement of a projection exposure apparatus (stepper) to which the present invention is applied. A rectangular pattern area PA formed on a reticle (mask) R is uniformly irradiated with illumination light from a condenser lens CL of an exposure illumination system. Light transmitted through the pattern area PA reaches a wafer W through a projection lens PL having telecentric lens surfaces on both sides or a telecentric lens surface on the image side. As a result, an image of the pattern area PA is projected on a predetermined shot area (a range into which the pattern area PA is transferred) on the wafer W. Reticle alignment microscopes $RA_1$ and $RA_2$ detect marks formed in peripheral portions of the reticle R to align the reticle R with an optical axis AX of the projection lens PL, or detect the positional shift amounts of the marks on the reticle R relative to marks on the wafer W to align the reticle R with the wafer W. A TTL (through the lens) alignment system WA serves to detect the marks on the wafer W through only the projection lens PL. The TTL alignment system WA has a mark detection area which is located inside the circular projection field of the projection lens PL and outside the projection range (rectangle) of the pattern area PA of the reticle R. Two such identical TTL alignment systems WA are arranged such that mark detection areas are set at two positions within the projection field.

The wafer W is held on a Z stage 20. The Z stage 20 is held on an XY stage 21. The Z stage 20 is designed to be finely moved in the optical axis AX direction (Z direction) with respect to the XY stage 21 by a driving system such as a motor 19. With this arrangement, a focusing operation is performed such that the upper surface of the wafer W is matched with the optimum image plane of the projection lens PL. A position on the upper surface of the wafer W in the optical axis AX direction is detected by an oblique incident type focus detection system. Non-exposure light (broad-band red light) from a light-emitting element AFP is obliquely incident on the wafer W, and the reflected light is received by a light-receiving element AFR. A detection signal (a signal changing in state in accordance with the magnitude of a focus shift) from the light-receiving element AFR is supplied to a focus control system AFU. The focus control system AFU sequentially detects the focus shift amount of the upper surface of the wafer W relative to the optimum image plane, and drives the motor 19 for the Z stage 20 until the focus shift amount falls within a predetermined tolerance.

The wafer W is exposed by a step-and-repeat scheme, in which a stepping position is detected as a two-dimensional coordinate value by a laser interferometer IFM. The laser interferometer IFM detects a coordinate position within a moving plane (X-Y plane) of the wafer W with a resolution of about 0.01 μm. The laser interferometer IFM is also used for mark position measurement and the like. The motor 40 serves to move the XY stage 21 (i.e., the wafer W) in the X and Y directions. The motor 40 is controlled by a stage control system STU. Upon reception of data of a target position to which the wafer W is to be moved, from a main control system MC, the stage control system STU calculates the difference between the target position and the current position measured by the laser interferometer IFM. The stage control system STU then drives the motor 40 at an optimum speed corresponding to the difference, and performs servo control of the motor 40 such that the count value of the laser interferometer IFM falls within a range of, e.g., ±5 (±0.05 μm) with respect to the target position.

The main control system MC receives measurement results obtained by the reticle alignment microscopes $RA_1$ and $RA_2$, a mark position measurement result obtained by the TTL alignment system WA, and the like, and exchanges data and commands with the focus control system AFU.

Especially in this embodiment, the main control system MC forms information associated with a target position to which the wafer W is to be moved by the step-and-repeat scheme, i.e., information associated with a stepping target position of the XY stage 21 (a design value in a first print operation; an actual measurement value determined by a measurement result obtained by measuring the mark positions on the wafer W in a second print operation). This processing will be described in detail later.

Figure 2:
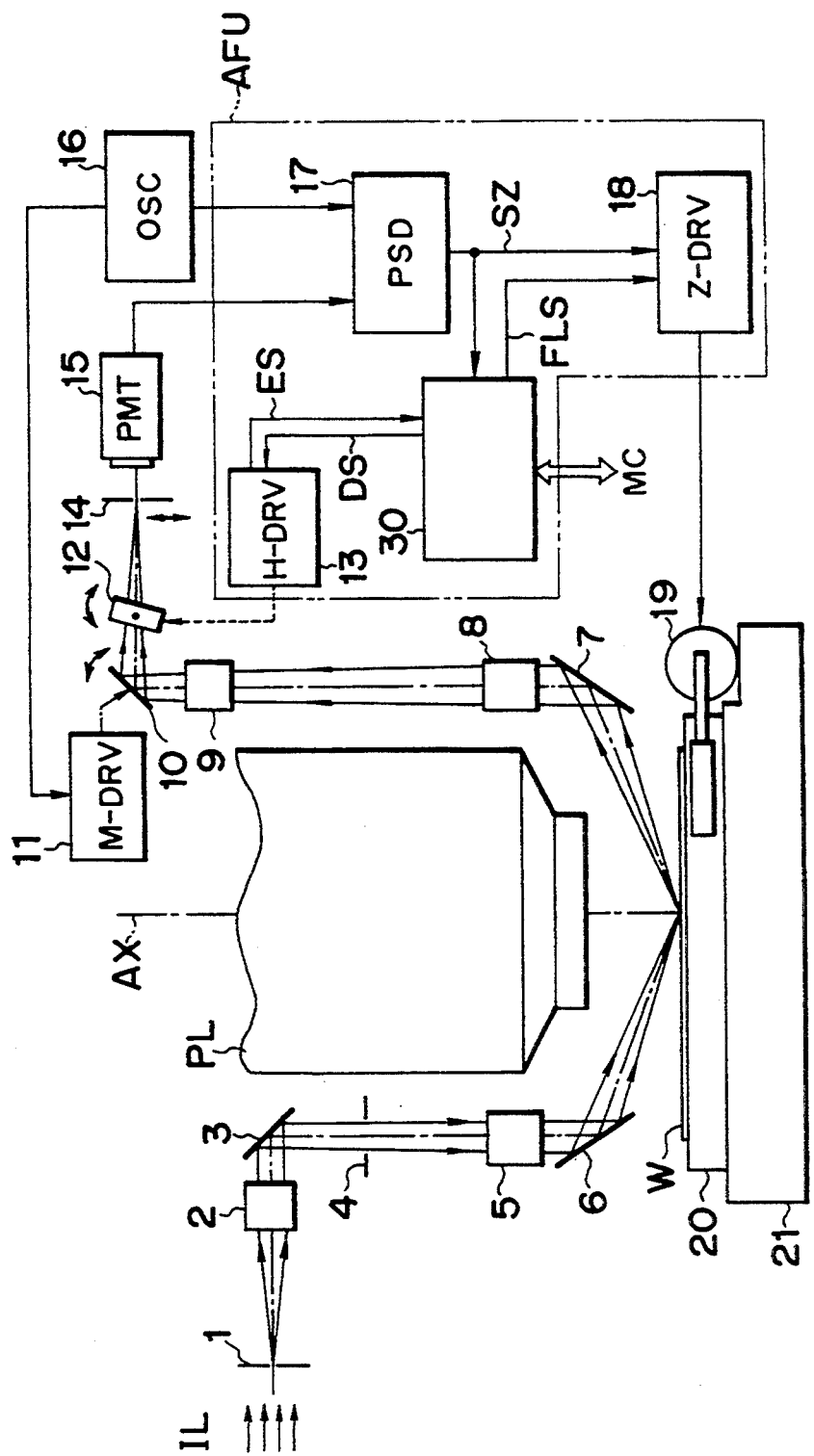
FIG. 2 is a block diagram showing the arrangement of a focus detection system.

FIG. 2 shows the detailed arrangements of the focus control system AFU, the light-emitting element AFP, and the light-receiving element AFR in FIG. 1. A slit 1 is illuminated with broad-band illumination light IL having a band in a red or infrared range. Light from the slit 1 is obliquely projected onto the upper surface of the wafer W through a lens system 2, a mirror 3, an aperture stop 4, an objective lens 5, and a mirror 6. At this time, an image of the slit 1 is formed on the wafer W. The reflected light of this slit image is formed on a detection slit 14 through a mirror 7, an objective lens 8, a lens system 9, a vibration mirror 10, and a variable-angle plane parallel glass (to be referred to as a plane parallel hereinafter) 12. A photo-multiplier 15 photoelectrically detects a slit image beam transmitted through the slit 14 and outputs the resultant photoelectric signal to a synchronization detector (PSD) 17. The vibration mirror 10 is vibrated within a predetermined angle range by a driving circuit (M-DRV) 11 in response to a sine-wave signal having a predetermined frequency and supplied from an oscillator (OSC.) 16. With this operation, the image of the slit 1, formed on the detection slit 14, is finely vibrated in a direction perpendicular to the longitudinal direction of the slit so that the photoelectric signal from the photo-multiplier 15 is modulated in accordance with the frequency of the OSC. 16. The PSD 17 performs phase detection of the photoelectric signal from the photo-multiplier 15 on the basis of an original signal from the OSC. 16, and outputs a resultant detection signal SZ to a processing circuit (CPX) 30 and a driving circuit (Z-DRV) 18 for driving the motor 19 for the Z stage 20. The detection signal SZ, which is output as an analog signal, is set at zero level when the upper surface is matched with the optimum image plane (reference plane); set at positive level when the wafer W is displaced, from the matched state, upward along the optical axis AX; and set at negative level when the wafer W is displaced in the opposite direction. If, therefore, the Z-DRV 18 also includes a servo amplifier based on zero level, the Z-DRV 18 drives the motor 19 such that the detection signal SZ becomes zero level. With this operation, auto focus of the wafer W can be achieved.

The processing circuit (CPX) 30 outputs a drive signal DS to a driving section (H-DRV) 13 for adjusting the inclination of the plane parallel 12 with respect to the optical axis. The H-DRV 13 incorporates a driving motor and an encoder for monitoring the inclination amount of the plane parallel 12. An up/down pulse output ES from the encoder is fetched by the CPX 30.

When a focusing operation is to be performed with respect to a stepping position (a shot area to be exposed) determined by the main control system MC, or a position shifted from an original target position by a predetermined amount, the CPX 30 outputs a signal FLS (focus lock signal), as a disable signal, to the Z-DRV 18 to allow a servo loop for auto focus to function in an ordinary way. In order to perform a focus lock (shift focus) operation, the signal FSL is enabled and output to the Z-DRV 18, when the focusing servo is stopped and the signal SZ loaded into the CPX 30 is set at zero level, thereby prohibiting driving of the Z stage 20 (driving of the motor 19).

Figure 3:
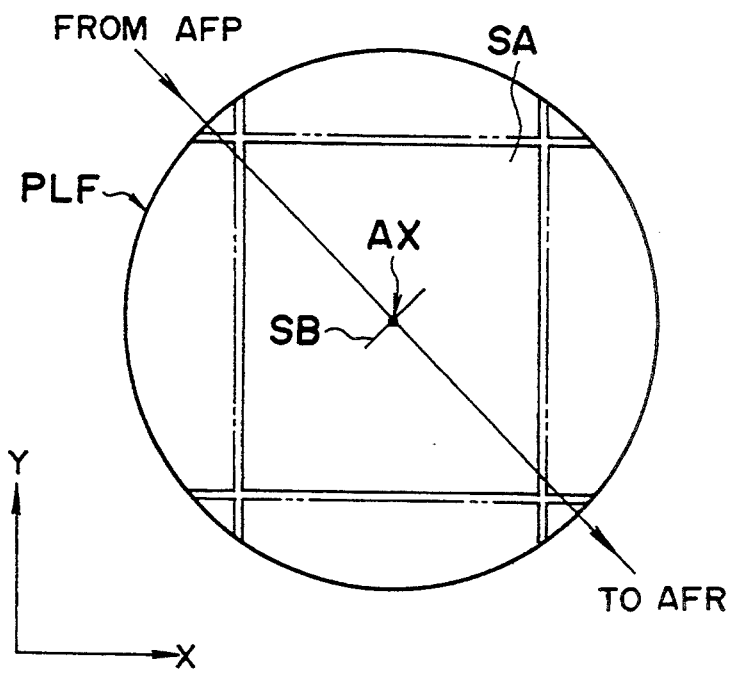
FIG. 3 is a view showing the positions of a focus detection point and a projection field with respect to a normal shot area in an exposure operation.
Figure 4:
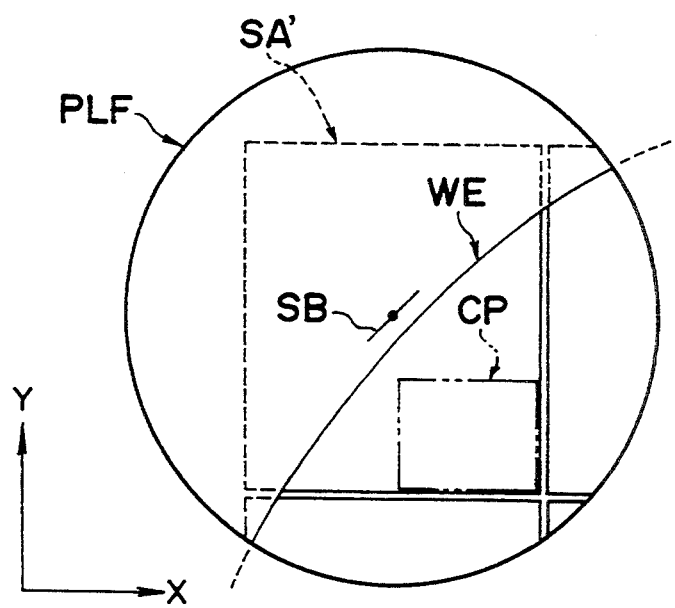
FIG. 4 is a view showing the positions of a focus detection point and a projection field with respect to a shot area on a peripheral portion in an exposure operation.

FIGS. 3 and 4 respectively show wafer surfaces appearing within a projection field PLF of the projection lens PL during step-and-repeat exposure. FIG. 3 shows a state wherein a shot area SA inside the wafer W is to be exposed. Normally, the optical axis AX of the projection lens PL is set to cross the central point of the shot area SA to be exposed. This is because alignment is performed such that the central point of the pattern area PA of the reticle R is matched with the optical axis AX.

An imaging beam from the light-emitting element AFP of the focus detection system is projected, as a slit image SB, onto the center of the projection field PLF. This slit image SB is inclined by 45° with respect to the X and Y directions so as not to be easily influenced by an uneven pattern within the shot area SA. The center of the slit image SB, i.e., a point which the optical axis AX passes, becomes a detection point of the focus detection system.

FIG. 4 shows a state wherein a shot area SA' located at a peripheral portion of the wafer W is to be exposed, and the slit image SB is located outside an outer peripheral end (edge) WE of the wafer W. When the shot area SA' is to be exposed in this state, the focus detecting system does not operate, and exposure is performed without performing a focusing operation in the prior art. If, however, the shot area SA' has a multi-chip configuration, one chip area CP may be properly contained inside the wafer edge WE, as shown in FIG. 4. It is, therefore, a principal object of the present invention to perform proper exposure with respect to such a chip area to increase the yield of chips.

Figure 5B:
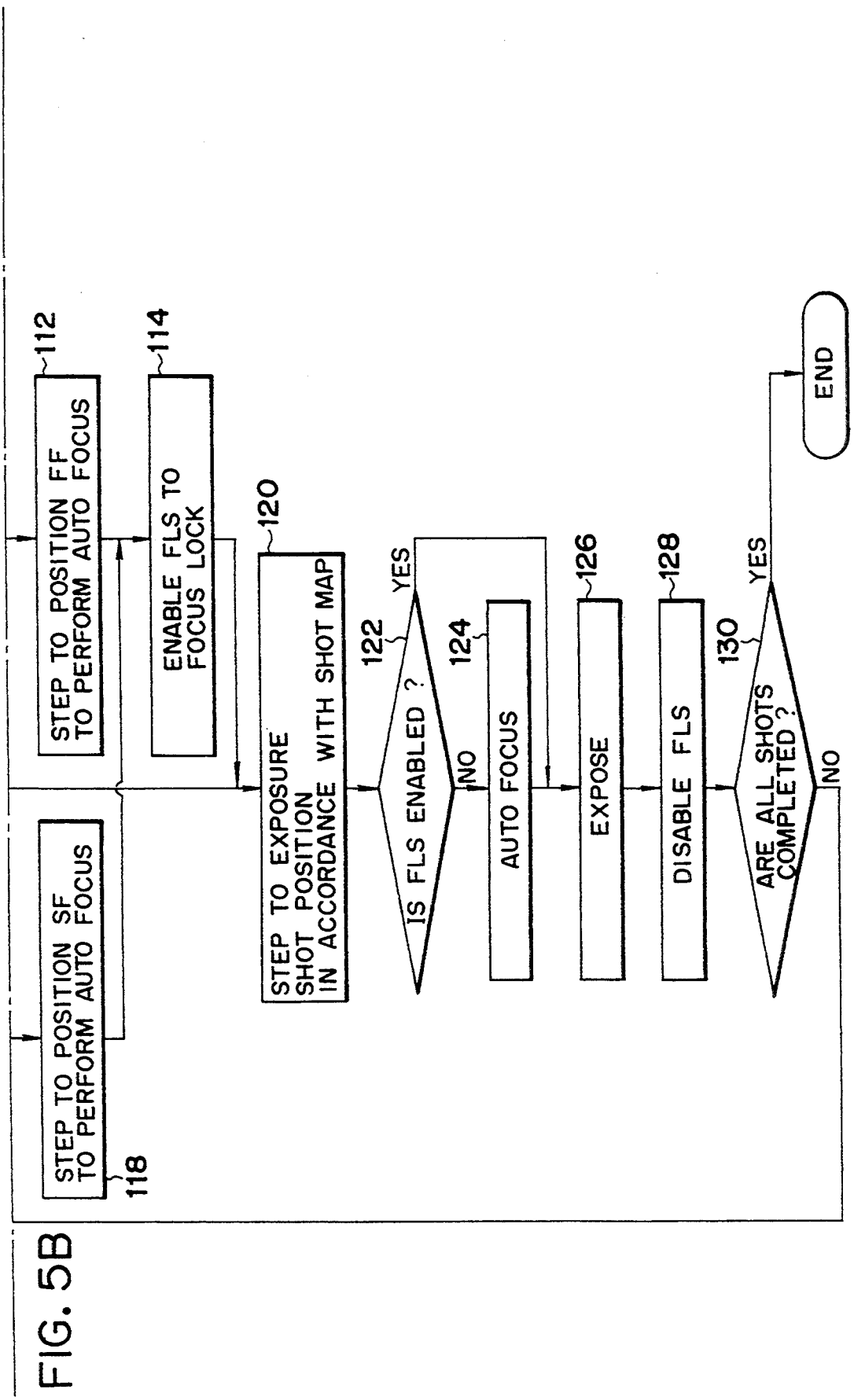
FIG. 5 is comprised of FIGS. 5A and 5B showing a flow charts for explaining a sequence in the first embodiment.

An operation of the first embodiment of the present invention will be described next with reference to FIGS. 5A and 5B. Referring to FIG. 5A, step 100 is mainly executed before a first print operation (exposure for the first layer), and step 102 is executed in time of a second print operation (overlap exposure for the second and subsequent layers). In step 100, the main control system MC produces optimum shot map data corresponding to the configuration of the wafer W on the basis of the configuration of the wafer W, a shot size, a step pitch, and the like. This shot map data represents how to arrange shot areas within the wafer W depending on the configuration of the wafer W. The shot map data is automatically determined by calculation and is registered, as a stepping coordinate position of the XY stage 21, in a memory. Furthermore, in step 100, the coordinate position of the central point of the wafer, the position of the boundary line of a prohibition band, and the like are set by calculation.

Figure 6:
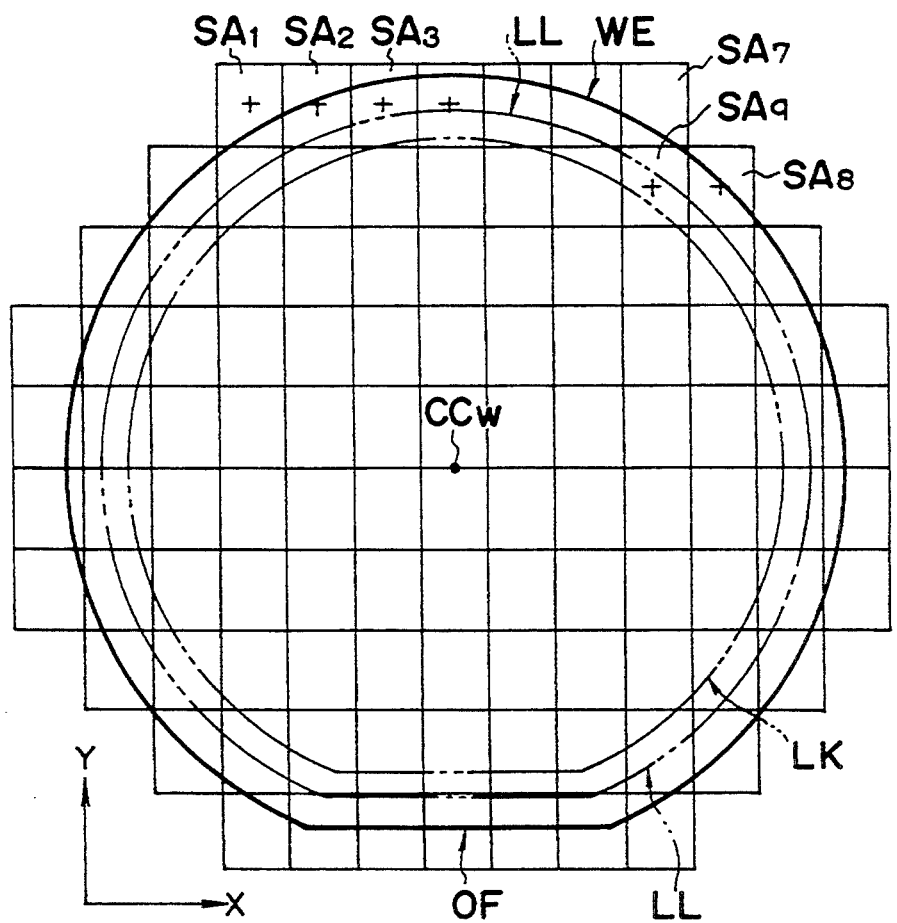
FIG. 6 is a view showing a relationship between the configuration of a wafer and a shot map.

FIG. 6 illustrates an example of shot map data determined in accordance with the configuration of a wafer. Referring to FIG. 6, each rectangle represents a shot area. A prohibition band indicates an area defined by the wafer edge WE of the wafer W and a line set closer to the center than the wafer edge WE by a predetermined width (about 1 to several mm), within which area focus detection is prohibited, as shown in FIG. 6. A boundary line determined in step 100 is a line LL in FIG. 6, which is defined by the radius of the wafer W having a center $CC_w$. In addition, a prohibition band (boundary line LL) having a predetermined width is set along a straight notched (orientation flat) portion OF. Generally, a prohibition band is set because nondefective chips can hardly be obtained owing to uneven coating of a resist, nonuniformity of processes, damage to the wafer edge WE, and the like. For this reason, although the width of a prohibition band may be fixed to a predetermined value, an input operation of a prohibition band width may be allowed so that the width can be slightly changed in accordance with a chip size.

Note that a line LK set closer to the center than the boundary line LL of the prohibition band in FIG. 6 represents a peripheral limit set when the inclination of a shot area is detected by a leveling sensor.

In the first print operation, step 100 is completed when only the above-described arithmetic processing is performed. In the second print operation, an offset amount with respect to the position of the wafer mounted on the Z stage 20 during the first print operation is obtained on the basis of the result of the wafer global alignment in step 102, and the offset amount is used as a correction value when the central point of the wafer and the position of the boundary line of a prohibition band are calculated in step 100. With this operation, offsets between the shot map (the matrix in FIG. 6) and the configuration of the wafer in the X and Y directions in the second print operation are corrected, and the state in the first print operation is always maintained.

In step 104, the main control system MC discriminates the condition of a shot area to be exposed on the basis of the shot map data. In step 104, the states of the positions of the wafer edge WE and the boundary line LL with respect to the shot area to be exposed on the shot map are discriminated. Assume that in FIG. 6, when step-and-repeat exposure is performed with respect to shot areas $SA_1$, $SA_2$, $SA_3$, . . . , $SA_7$ in this order, with the shot area $SA_1$ at the uppermost left position on the shot map being considered as the first shot, stepping is performed with respect to a shot area $SA_8$ at an oblique lower right position relative to the shot area $SA_7$, and step-and-repeat exposure is performed in the opposite direction to the X direction. Note that the central points of the shot areas $SA_1$, $SA_2$, and $SA_3$ are represented by the cross-shaped marks in FIG. 6.

Consider the first shot area $SA_1$ in FIG. 6. Although part of the area exists on the wafer W, the entirety of the area exists outside the boundary line LL of the prohibition band, and the central point of the shot is also located outside the wafer edge WE. The main control system MC discriminates a shot area in such a state as a first type. Part of the second shot area $SA_2$ exists inside the boundary line LL, the central point of the shot (with which the detection point of the focus detection system is matched in an exposure operation) exists within the prohibition band. The main control system MC discriminates a shot in such a state as a second type. This equally applies to the third shot area $SA_3$. Consider a ninth shot area $SA_9$. The central point of this shot is located inside the boundary line LL. In this case, a focusing operation can be properly performed at the exposure position.

Whether a given shot is the first or second type can be determined by, e.g., calculating by a mathematical technique whether a line connecting the central point $CC_w$ of the wafer W to the central point of a shot area of interest crosses the boundary line LL or the wafer edge WE. More specifically, when the line connecting the central point of the shot area to the central point $CC_w$ of the wafer crosses both the wafer edge WE and the boundary line LL, it is determined that the shot area is of the first type. If the line crosses only the boundary line LL, it is determined that the shot area is of the second type.

In other words, whether a given shot is of the first or second type is determined as follows. Of shot regions having the central points located outside the boundary line LL, a shot having a portion which does not cross the boundary line LL is determined as the first type, and a shot having a portion which crosses the boundary line LL is determined as the second type.

In steps 106 and 108, the main control system MC executes one of three modes in accordance with the state of the shot to be exposed.

If, for example, the shot area to be exposed is the area $SA_9$, it is determined in steps 106 and 108 that the shot area is neither the first type nor the second type but is a proper focusing shot, and the flow advances to step 120.

In step 120, the main control system MC calculates a coordinate position at which the shot area $SA_9$ on the wafer W overlaps a projection image of the pattern area PA of the reticle R, and outputs it as a target value to the stage control system STU. The XY stage 21 performs stepping in accordance with the target value. In step 122, the main control system MC checks the state of the focus lock signal FLS through the CPX 30. If the signal FLS is enabled (a focus lock operation is being executed), the flow advances to step 126. If the signal FLS is disabled (focus lock is canceled), auto focus (a focusing operation by means of fine movement of the Z stage 20) is executed in step 124. In the case of the shot area $SA_9$ shown in FIG. 6, the signal FLS is disabled, and hence auto focus is performed, as is normally performed.

In step 126, exposure is performed. After exposure, the signal FLS is disabled in step 128. Step 128 is performed to cancel focus lock of the exposed shot area, if the area is set in a focus lock state. If the signal FLS has already been disabled in step 126, step 128 is ignored.

When exposure of one shot area is completed in this manner, it is checked in step 130 whether exposure of all the shot areas is completed. If NO in step 130, the sequence starting from step 104 is repeated to expose the next shot area.

If it is determined in step 106 that a shot area to be exposed belongs to the first type like the shot area $SA_1$, the main control system MC executes step 120 upon executing steps 110 and 114. Operations in steps 110, 112, and 114 will be described below with reference to FIG. 7.

Figure 7:
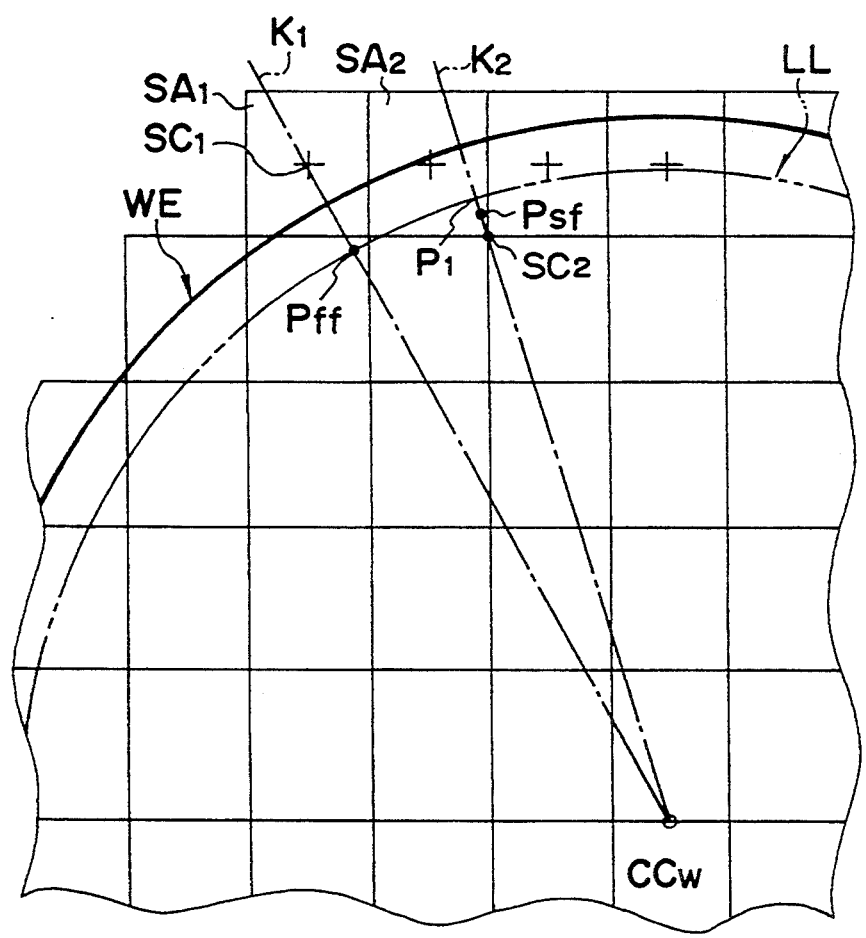
FIG. 7 is an enlarged view of part of the shot map.

In step 110, since the entire shot area $SA_1$ is located outside the boundary line LL of the prohibition band, arithmetic processing is performed to forcibly move the focus point to a given position within an adjacent shot area. As shown in FIG. 7, the main control system MC sets a straight line $K_1$ connecting the wafer central point $CC_w$ to a central point $SC_1$ of the shot area $SA_1$ and calculates a coordinate position FF of a point $P_{ff}$ at which the straight line $K_1$ crosses the boundary line LL. This calculation can be immediately executed by geometric analysis because the position of the central point $CC_w$, the position of the shot central point $SC_1$, and the radius of the boundary line LL are known in advance. As described above, in processing a given shot area belonging to the first type, a point to be focus-detected by shift focus is set on the boundary line LL within an adjacent shot area which is located closer to the center than the given shot area.

In step 112, the main control system MC moves the XY stage 21 to the coordinate position (also called a forced shift focus position) FF of the calculated point $P_{ff}$ as a target value. With this operation, the slit image SB of the focus detection system is projected onto the point $P_{ff}$. The Z stage 20 is moved in response to the detection signal SZ obtained by the focus detection system, and an auto focus (AF) operation is executed at the point $P_{ff}$.

When the Z stage 20 comes to rest, and the AF operation is completed, the main control system MC enables the signal FLS through the CPX 30 to set a focus lock state in step 114. Immediately after this operation, the flow advances to step 120 to move and position the XY stage 21 to the coordinate position at which the shot area $SA_1$ is exposed.

As described above, a shot area of the first type is located completely outside the prohibition band. Even if, therefore, a focusing operation is not executed at all, no practical problems are posed because there is no chip to be saved in the shot area. For this reason, in order to meet the demand for a focusing operation even with respect to a shot area of the first type, the wafer is moved to a focus allowable position nearest to the shot central point $SC_1$ (i.e., a position on the boundary line LL or a vicinity of the position). With this operation, when the XY stage 21 is moved to the shot central point $SC_1$ as an exposure position upon execution of an auto focus (AF) operation at the point $P_{ff}$, the moving amount corresponds to the shortest distance.

If it is determined in step 108 in FIG. 5A that a shot area to be exposed is of the second type, the main control system MC executes a focus lock operation after executing steps 116 and 118. Steps 116 and 118 will be described below with reference to FIG. 7. Consider the shot area $SA_2$ in FIG. 7 as a shot area of the second type. In this case, since part of the shot area $SA_2$ exists within the focus detection allowable range inside the boundary line LL, the main control system MC calculates a specific point which is present in the shot area $SA_2$, inside the boundary line LL, and is nearest to the wafer center. This calculation can be easily executed on the basis of the position of the wafer central point $CC_w$, the size of the shot area $SA_2$, and the radius of the boundary line LL. As a result, in the case of the shot area $SA_2$ in FIG. 7, the position of a corner, of the shot area, which is located nearest to the wafer center is determined as the specific point $SC_2$.

Subsequently, the main control system MC sets a straight line $K_2$ connecting the specific point $SC_2$ to the wafer central point $CC_w$ and calculates a point $P_1$ at which an extended portion of the straight line $K_2$ crosses the boundary line LL. In addition, the main control system MC calculates a coordinate position SF of a point $P_{sf}$, on the straight line $K_2$, which divides the line segment between the point $P_1$ and the specific point $SC_2$ at a predetermined ratio ($\frac{1}{2}$ is preferable for the sake of simple calculation). This point $P_{sf}$ is a point at which shift focus is performed. In step 118, the XY stage 21 is moved to the coordinate position SF, thus executing an auto focus operation. Subsequently, the above-described sequence from step 114 will be executed.

As described above, in the case of a shot area of the second type, a point at which a focusing operation is to be performed is shifted to a position within a focus detection allowable range within the shot area. Therefore, this operation will be referred to as an ordinary shift focus operation hereinafter.

As is apparent from the arrangement of the shot areas in FIG. 7 and the sequence shown in FIGS. 5A and 5B, stepping movement of the XY stage 21 to an exposure position (a shot central point) is always performed after a moving operation by means of a shift focus operation. In the case shown in FIG. 7, therefore, when step-and-repeat exposure is to be performed from the first shot area $SA_1$ upon completion of global alignment (EGA or the like) of the wafer, stepping movement of the XY stage 21 is performed through the following path: point $P_{ff}$ (focusing)→shot central point $SC_1$ (exposure)→ point $P_{sf}$ (focusing)→central point of shot area $SA_2$ (exposure).

In the sequence shown in FIGS. 5A and 5B, after exposure with respect to one shot area is completed, the sequence for discriminating the type of the next shot area and calculating a shift focus point (steps 104, 106, 108, 110, and 116) is executed. However, since the time required for these calculations can be set to be sufficiently shorter than the exposure time (0.1 to 0.5 sec) for one shot area, a sequence may be designed such that a shift focus point is obtained in advance during an exposure operation for the previous shot area, and step 112 or 118 is executed at the same time when the exposure operation is completed.

When the algorithm shown in FIG. 7 is applied to a shot area of the second type, an inconvenience may be caused depending on the manner in which the boundary line LL crosses the shot area. An algorithm in which the inconvenience is eliminated will be described as the second embodiment with reference to FIG. 8. This algorithm is executed in step 116 in the sequence shown in FIG. 5A, and hence the overall sequence is not changed.

Figure 8:
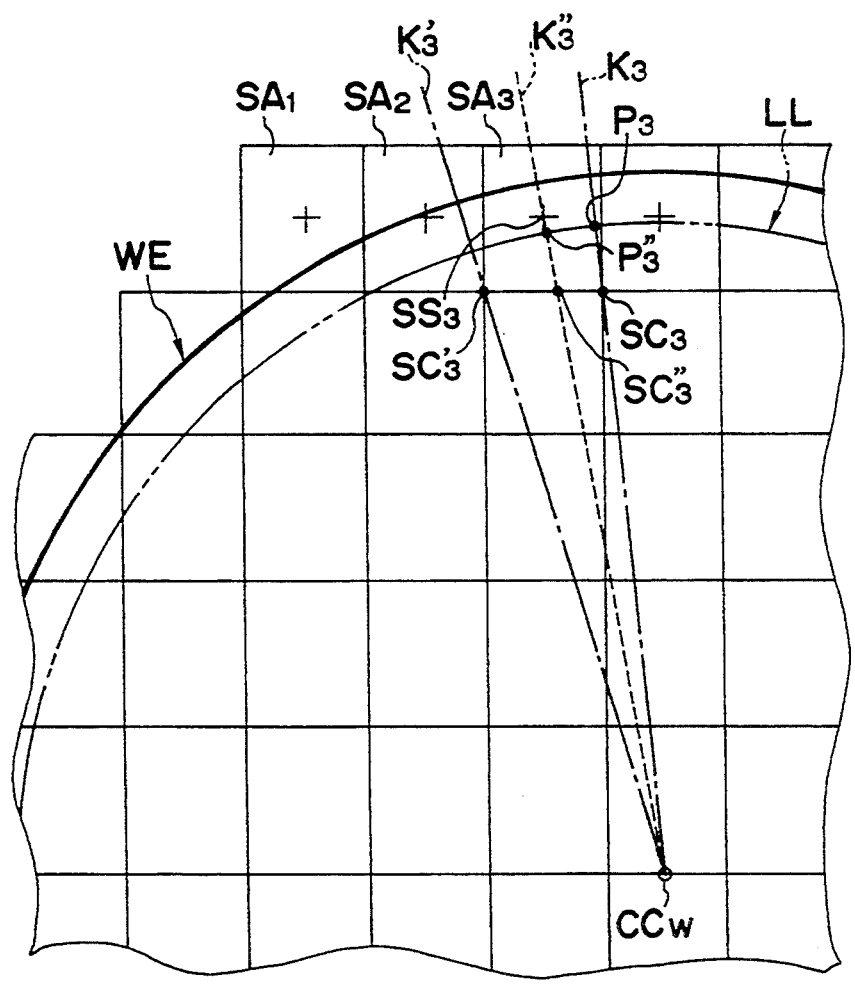
FIG. 8 is an enlarged view showing part of the shot map to explain a method in the second embodiment.

Consider a shot area $SA_3$ (identical to the one shown in FIG. 6) shown in FIG. 8. Since a shot central point $SS_3$ of the shot area $SA_3$ exists within the prohibition band, the shot area belongs to the second type. In the first embodiment, a specific point $SC_3$, in the shot area $SA_3$, which is nearest to the wafer center is determined. In addition, a straight line $K_3$ passing the specific point $SC_3$ and an intersection point $P_3$ between the straight line $K_3$ and a boundary line LL are determined. With this operation, a point of an ordinary shift focus position SF is set somewhere on a line segment connecting the point $P_3$ and the specific point $SC_3$.

In the case of the shot area $SA_3$, however, the straight line $K_3$ passes a portion, of the shot area $SA_3$, which is located near an edge of an effective portion within a focus detection allowable range. That is, the shift focus position SF determined by the above-described algorithm does not typically reflect the effective portion.

In the second embodiment, therefore, a determining function is added to the algorithm of the first embodiment to further optimize a shift focus position. First, the point $P_3$ and the specific point $SC_3$ are obtained, and a point $P_{sf}$ at which the line segment, of the straight line $K_3$, between the points $P_3$ and $SC_3$ is equally divided is obtained in accordance with the normal algorithm. Second, a point $SC_3'$ as a corner, of the shot area $SA_3$, which is located close to the wafer center is obtained, and a straight line $K_3'$ connecting the point $SC_3'$ to a wafer central point $CC_w$, and a straight line $K_3''$ connecting the central point $SS_3$ of the shot area $SA_3$ to the wafer central point $CC_w$ are set. It is then checked, under the condition that the point $SC_3'$ is located inside the boundary line LL, whether the straight line $K_3''$ is located between the two straight lines $K_3$ and $K_3'$ at almost an equal distance therefrom. If the straight line $K_3''$ is located between these two straight lines at almost an equal distance therefrom, a point is set on the straight line $K_3''$ at a distance, from the wafer central point $CC_w$, which is equal to the distance between the previously obtained shift focus point $P_{sf}$ on the straight line $K_3$ and the wafer central point $CC_w$. This set point is used as an actual shift focus point.

Alternatively, an intersection point $SC_3''$ between a line connecting the point $SC_3'$ to the specific point $SC_3$ and the straight line $K_3''$, and an intersection point $P_3''$ between the straight line $K_3''$ and the boundary line LL are obtained, and a point, on the straight line $K_3''$, at which the line segment between the point $P_3'$ and the point $SC_3'$ is equally divided may be set as an actual shift focus point.

According to the above-described algorithm, a shift focus position can be set as a point almost accurately representing a portion, of a shot area, which is located inside a focus detection allowable range.

A shift focus operation according to the third embodiment will be described next. In the third embodiment, in order to suppress a reduction in throughput, the following sequence is set. In the sequence, a forced shift focus operation is not performed with respect to all shot areas belonging to the first type, but is performed only when the first shot on a wafer is of the first type, and a focus lock operation is performed with respect to a shot area of the first type appearing in the process of step-and-repeat exposure.

A sequence according to the third embodiment will be described below with reference to FIGS. 9A and 9B. Although the flow chart shown in FIGS. 9A and 9B is basically the same as that shown in FIGS. 5A and 5B, they are different from each other in that step 132 of switching the signal FLS to a disabled state (focus servo mode) is added between steps 106 and 108 in FIG. 5A, decision step 134 is added to execute steps 110, 112, and 114 only when YES is obtained in step 106 in FIG. 5A and step 124 in FIG. 5B, in which an AF operation is executed, is changed to step 124' of switching the signal FLS to an enable state (focus lock mode) upon execution of an AF operation.

Referring to FIGS. 9A and 9B, if it is determined in step 106 that a shot area to be exposed is of the first type, it is further checked in step 134 whether the shot area is the first (start) shot area. If NO in step 134, steps 120 and 122 are executed. If YES in step 134, steps 110, 112, and 114 are executed to perform a forced shift focus operation, and the flow advances to step 120. For example, in the case of the shot map shown in FIGS. 6 to 8, exposure is performed with respect to the shot area SA$_1$ as the first shot by executing steps 106, 134, 110 to 114, 120, 122, and 126 in the order named. In this case, a focus lock state is set in step 114 and is maintained unless step 132 is executed in a processing routine for the next shot area. In the case of the next shot area SA$_2$, since the flow advances to steps 106, 132, and 108 to determine the shot area as the second type, steps 116, 118, 114, 120, 122, and 126 are sequentially executed in the order named, similar to the case shown in FIGS. 5A and 5B.

Assume that step-and-repeat exposure is sequentially performed in this manner, and it is determined in step 106 in the process of exposure that a shot area to be exposed next is determined as the first type. In this case, since a focus lock state is set in step 124' when exposure with respect to the previous shot area is completed, the flow advances to step 134 instead of step 132. In this case, since it is determined in step 134 that the shot area is not the first shot, the flow advances to step 120. That is, when a shot area other than the first shot is determined as the first type, steps 106, 134, 120, 122, and 126 are executed in the order named, and exposure is performed in a focused state with respect to the immediately preceding shot area instead of performing a forced shift focus operation (steps 110 to 114).

Assume that the first shot is of the first type, and the second shot is of an ordinary type (neither the first type nor the second type). In this case, steps 106, 132, 108, 120, 122, 124', and 126 are executed in the order named with respect to the second shot area, thus performing an ordinary auto focus operation.

If both the first and second shots are of the first type, steps 106, 134, 120, 122, and 126 are performed in the order named with respect to the second shot area, thus performing exposure in the same focus position as that in a forced shift focus state for the first shot.

If a forced shift focus operation for a shot of the first type is limited to the first shot, and exposure with respect to each of other shots of the first type is performed in a focused state set for an immediately preceding shot, as in the second embodiment, the number of times that an XY stage 21 is moved during a forced shift focus operation is greatly reduced to suppress a reduction in throughput.

Each embodiment of the present invention has been described above. However, the present invention is not limited to these embodiments, and various modifications can be made. For example, in an ordinary shift focus operation, the center of gravity of the area of a portion, of a shot area, which is located inside the boundary line LL may be obtained, and the center of gravity may be set as the shift focus position SF.

In calculating a focus point for an ordinary focus operation with respect to a shot of the second type, such a focus point may always be obtained on a straight line connecting a shot central point and the wafer central point CC$_w$.

Recently, an oblique incident type focus detection system having a large number of detection points other than a central point in the projection field PLF (multi-point focus sensor) has been proposed. If a shot area located outside the boundary line LL is set as a target for a shift focus operation while at least one detection point is in an exposed state, each embodiment of the present invention can be directly applied to such a focus detection system.

In each embodiment of the present invention, the detection point (slit image SB) of the focus detection system is located in the center of the projection field PLF. However, the detection point may be set at any position as long as the positional relationship between the detection point and the optical axis AX (shot central point) of the projection lens PL is known in advance.

In addition, the present invention is not limited to an exposure operation with respect to a circular wafer, and can be equally applied to a case wherein a plurality of shot areas on a rectangular photosensitive substrate are to be exposed.

As has been described above, according to the present invention, of chips in shot areas formed on a peripheral portion of a photosensitive substrate, chips located inside a prohibition band extending from the edge of the substrate to have a predetermined width can be exposed in an almost proper focused state. Therefore, the yield of chips is increased. Furthermore, according to the present invention, since a point subjected to focus detection is shifted in the direction of a straight line (radial direction) passing the center of a photosensitive substrate, the moving amount of the substrate can be reduced.

What is claimed is:

1. A projection exposure apparatus for exposing a projection image of a rectangular pattern area formed on a mask, which image is formed by a projection optical system, on each of a plurality of shot areas on a photosensitive substrate mounted on a two-dimensional moving stage by a step-and-repeat scheme, comprising:
focus detection means, having a detection point at a predetermined position within a field of view of said projection optical system, for detecting a position of an upper surface of the photosensitive substrate along a direction of an optical axis of said projection optical system relative to the detection point for a focusing operation;

means for discriminating, based on design arrangement information of the plurality of shot areas with respect to a configuration of the photosensitive substrate, a shot area entirely located outside a boundary line of a prohibition band of predetermined width extending from an outer peripheral end of the photosensitive substrate as a shot area of a first type, and a shot area within the field of view of said projection optical system and partly located inside the boundary line of the prohibition band while the detection point of said focus detection system is located outside the boundary line as a shot area of a second type;

first shift control means operative, when a focusing operation is to be performed with respect to a shot area of the first type in an exposure operation, for temporarily shifting said moving stage such that a point at which a straight line passing through a specific point in the shot area and a central point of the photosensitive substrate crosses the boundary line is substantially matched with the detection point of said focus detection means; and second shift control means operative, when a focusing operation is to be performed with respect to a shot area of the second type in an exposure operation, for temporarily shifting said moving stage such that a point located on a straight line passing through a closest point of the shot area to the central point of the photosensitive substrate and through the central point of the photosensitive substrate, and located within the shot area inside the boundary line, is substantially matched with the detection point of said focus detection means.

2. An apparatus according to claim 1, wherein said focus detection means includes means for radiating illumination light onto the photosensitive substrate from an oblique direction with respect to the optical axis of said projection optical system, and reception means for receiving light reflected by the photosensitive substrate and outputting a photoelectric signal corresponding to a positional shift amount of the upper surface of the photosensitive substrate with respect to a predetermined reference plane.

3. A projection exposure apparatus for exposing a projection image of a rectangular pattern area formed on a mask, which image is formed by a projection optical system, on each of a plurality of shot areas on a photosensitive substrate mounted on a two-dimensional moving stage by a step-and-repeat scheme, comprising:

focus detection means, having at least one detection point substantially at a center of a field of view of said projection optical system, for detecting a position of an upper surface of said photosensitive substrate along a direction of an optical axis of said projection optical system relative to the detection point for a focusing operation;

means for discriminating, based on design arrangement information of the plurality of shot areas with respect to a configuration of the photosensitive substrate, a specific shot area having a central point located outside a boundary line of a prohibition band extending from a peripheral end of the photosensitive substrate with a predetermined width smaller than a size of the shot area; and shift control means operative, when a focusing operation is to be performed with respect to the specific shot area in an exposure operation, for temporarily shifting said moving stage such that a point located on a straight line connecting a specific point of the shot area to a central point of the photosensitive substrate and also located in the shot area inside the boundary line, or located in an adjacent shot area, is substantially matched with the detection point of said focus detection means.

4. An apparatus according to claim 3, wherein said focus detection means includes means for radiating illumination light onto the photosensitive substrate from an oblique direction with respect to the optical axis of said projection optical system, and reception means for receiving light reflected by the photosensitive substrate and outputting a photoelectric signal corresponding to a positional shift amount of the upper surface of the photosensitive substrate with respect to a predetermined reference plane.

5. A projection exposure method of exposing a projection image of a rectangular pattern area formed on a mask, which image is formed by a projection optical system, on each of a plurality of shot areas on a photosensitive substrate mounted on a two-dimensional moving stage by a step-and-repeat scheme, comprising the steps of:

selecting, based on design arrangement information of the plurality of shot areas with respect to a configuration of the photosensitive substrate, a specific shot area which has a central point located outside a boundary line of a prohibition band of predetermined width extending from an outer peripheral end of the photosensitive substrate;

temporarily shifting said moving stage such that a point located on a straight line connecting a specific point in the shot area to a central point of the photosensitive substrate and also located in the shot area inside the boundary line, or located in an adjacent shot area, is substantially matched with a focus detection point having a predetermined position in a field of view of said projection optical system; and detecting a position of an upper surface of the thus shifted photosensitive substrate along an optical axis direction of the projection optical system in order to perform a focusing operation with respect to the selected shot area in an exposure operation.

* * * * *